US009570192B1

(12) United States Patent
Yoon et al.

(10) Patent No.: US 9,570,192 B1
(45) Date of Patent: Feb. 14, 2017

(54) SYSTEM AND METHOD FOR REDUCING PROGRAMMING VOLTAGE STRESS ON MEMORY CELL DEVICES

(71) Applicant: QUALCOMM Incorporated, San Diego, CA (US)

(72) Inventors: Sei Seung Yoon, San Diego, CA (US); Anil Kota, San Diego, CA (US); Bjorn Grubelich, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/061,882

(22) Filed: Mar. 4, 2016

(51) Int. Cl.
*G11C 8/00* (2006.01)
*G11C 17/16* (2006.01)
*G11C 8/08* (2006.01)
*G11C 8/10* (2006.01)
*G11C 7/06* (2006.01)

(52) U.S. Cl.
CPC ............... *G11C 17/16* (2013.01); *G11C 7/06* (2013.01); *G11C 8/08* (2013.01); *G11C 8/10* (2013.01)

(58) Field of Classification Search
CPC ............ G11C 17/16; G11C 8/08; G11C 8/10; G11C 7/06
USPC ........................................ 365/230.06, 189.16
See application file for complete search history.

(56) References Cited

U.S. PATENT DOCUMENTS

| 6,088,286 | A | * | 7/2000 | Yamauchi | ........... | G11C 11/4074 |
| | | | | | | 365/230.03 |
| 6,249,477 | B1 | * | 6/2001 | Ohtsuki | .................. | G11C 8/08 |
| | | | | | | 365/189.09 |
| 6,768,685 | B1 | | 7/2004 | Scheuerlein | | |
| 7,002,825 | B2 | | 2/2006 | Scheuerlein | | |
| 7,298,665 | B2 | | 11/2007 | So et al. | | |
| 7,609,569 | B2 | | 10/2009 | Fragano et al. | | |
| 8,787,096 | B1 | | 7/2014 | Terzioglu et al. | | |
| 8,830,779 | B1 | | 9/2014 | Terzioglu et al. | | |
| 9,082,498 | B2 | | 7/2015 | Uvieghara et al. | | |
| 2002/0176312 | A1 | * | 11/2002 | Lee | ........................ | G11C 8/08 |
| | | | | | | 365/230.06 |
| 2004/0130926 | A1 | * | 7/2004 | Nakase | ................... | G11C 7/06 |
| | | | | | | 365/145 |
| 2006/0126380 | A1 | * | 6/2006 | Osada | ................ | G11C 11/5678 |
| | | | | | | 365/163 |
| 2008/0068875 | A1 | * | 3/2008 | Choi | ....................... | G11C 8/14 |
| | | | | | | 365/148 |
| 2008/0165598 | A1 | * | 7/2008 | Park | ....................... | G11C 8/08 |
| | | | | | | 365/189.18 |

(Continued)

Primary Examiner — Viet Q Nguyen
(74) Attorney, Agent, or Firm — Loza & Loza LLP

(57) ABSTRACT

A memory array includes a first subarray of memory cells and a second set of memory cells. The first and second subarrays of memory cells share a set of global word lines. The first and second subarrays of memory cells are coupled to first and second sets of bit lines, respectively. The first subarray includes rows of memory cells coupled to a first set of local word line drivers via a first set of local word lines, respectively. The second subarray includes rows of memory cells coupled to a second set of local word line drivers via a second set of local word lines, respectively. A selected local word line drivers generates a first asserted local word line signal for accessing at least one memory cell for reading or programming purpose in response to receiving a second asserted signal via a global word line and a third asserted signal.

27 Claims, 7 Drawing Sheets

(56) References Cited

U.S. PATENT DOCUMENTS

| | | | |
|---|---|---|---|
| 2009/0316474 A1* | 12/2009 | Cho | G11C 29/808 365/163 |
| 2010/0271862 A1* | 10/2010 | Yoon | G11C 8/10 365/148 |
| 2011/0063890 A1* | 3/2011 | Tonomura | G11C 5/08 365/148 |
| 2012/0230130 A1* | 9/2012 | Sheppard | G11C 8/14 365/189.011 |
| 2012/0257437 A1* | 10/2012 | Seko | G11C 11/5678 365/148 |
| 2015/0269978 A1 | 9/2015 | Jung et al. | |
| 2015/0364196 A1 | 12/2015 | Lin et al. | |

\* cited by examiner

US 9,570,192 B1

SYSTEM AND METHOD FOR REDUCING PROGRAMMING VOLTAGE STRESS ON MEMORY CELL DEVICES

BACKGROUND

Field

Aspects of the present disclosure relate generally to memories, and in particular, to a system and method for reducing gate-oxide voltage stress during programming of memory cell devices.

Background

Often, an integrated circuit (IC), such as a System on Chip (SOC), includes a one-time-programmable (OTP) memory that allows one or more cores of the IC to permanently write data to the memory. The OTP memory typically does not contain data when the IC is manufactured. During initialization or subsequently throughout the course of operation of the IC, one or more cores may permanently write data to the OTP, such as, for example, calibration data, initialization data, identification data, or other data as needed.

An OTP memory typically includes a two-dimensional array of memory cells. Memory cells common to rows are coupled to corresponding word lines (WLs) of the memory. Memory cells common to a column are coupled to corresponding bit lines (BLs) of the memory. Each memory cell of an OTP memory may be configured as an electronic fuse (EFUSE) type cell, where the cell includes a fuse element coupled in series with a transistor (e.g., in series with the drain and source of a field effect transistor (FET)) between the corresponding bit line (BL) and a power rail VSS (e.g., ground). Each transistor of each memory cell includes a control terminal (e.g., gate) coupled to the corresponding word line (WL).

Generally, the programming of (writing data to) an OTP memory may be performed a single-bit at a time. In this regard, the voltages on the word line (WL) and the bit line (BL) corresponding to the memory cell (to-be-programmed) are both raised to programming voltage (e.g., 1.8V). This produces a current through the corresponding fuse element and FET sufficient to blow the fuse element (e.g., produce an open in the fuse metallization due to electromigration). A memory cell that has its fuse blown may be assigned a bit value (e.g., a logic one (1)), and a memory cell that has not had its fuse blown may be assigned another bit value (e.g., a logic zero (0)).

Generally, the programming voltage of an OTP memory cell is higher than a rating for core devices (e.g., FETs). For example, a core FET may have a voltage rating of no more than 1.0V, whereas a programming voltage of 1.8V would exceed the rating of such core device. As a consequence, OTP memory cells have been traditionally configured with higher rated device, such as those used for input/output (I/O) operations where the gate oxide of such devices are made thicker to be able to withstand the programming voltage. However, using higher-rated devices has a drawback as the OTP memory has to occupy a substantial amount of area of an IC.

It would be desirable to implement an OTP memory using lower rated devices, such as core devices, to reduce the IC area required to implement the memory, and at the same time, reduce stress to the core devices associated with the programming voltage.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to a memory. The memory includes a first global word line; a first set of bit lines; a first local word line; a first set of memory cells coupled to the first local word line and coupled to the first set of bit lines, respectively; and a first local word line driver configured to generate a first asserted signal on the local word line in response to receiving a second asserted signal from the global word line and a third asserted signal.

Another aspect of the disclosure relates to a method of accessing at least one memory cell. The method includes generating a first asserted signal on a global word line; generating a second asserted signal; and generating a third asserted signal on a local word line for accessing at least one of a set of memory cells in response to receiving the first asserted signal from the global word line and the second asserted signal.

Another aspect of the disclosure relates to an apparatus including means for generating a first asserted signal on a global word line; means for generating a second asserted signal; and means for generating a third asserted signal on a local word line for accessing at least one of a set of memory cells in response to receiving the first asserted signal from the global word line and the second asserted signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
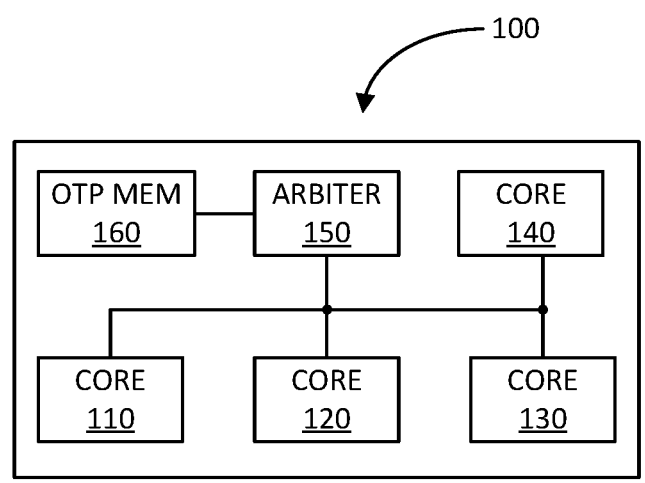
FIG. 1 illustrates a block diagram of an exemplary integrated circuit (IC) in accordance with an aspect of the disclosure.

FIG. 1 illustrates a block diagram of an exemplary integrated circuit (IC) 100 in accordance with an aspect of the disclosure. As an example, the IC 100 may be configured as a system on chip (SOC). The IC 100 includes a set of one or more cores, such as cores 110, 120, 130, and 140. Each core may be configured to perform a certain function. For example, there may be a central processing unit (CPU) core, a graphics core, a modem core, and others.

As discussed above, the IC 100 includes a one-time-programmable (OTP) memory 160 and an associated arbiter or secured processor 150. The OTP memory 160 may be based on EFUSE-type cells or antifuse-type cells. When manufacturing of the IC 100 has been completed, the OTP memory 160 may be blank, e.g., does not contain any data. The OTP memory 160 may be used by the one or more cores 110-140 as needed to permanently write data to the memory. As previously discussed, often the one or more cores 110-140 may write data to the OTP memory 160 during initialization of the IC 100. Such data may include calibration data, identification data (types or versions of the cores), and other initialization data. Additionally, if needed, the one or more cores 110-140 may permanently write data to the OTP memory 160 during operations beyond initialization. When accessing the OTP 160 for programming and reading purposes, the one or more 110-140 sends access requests to the arbiter 150, which grants or denies such requests for security reasons.

Figure 2:
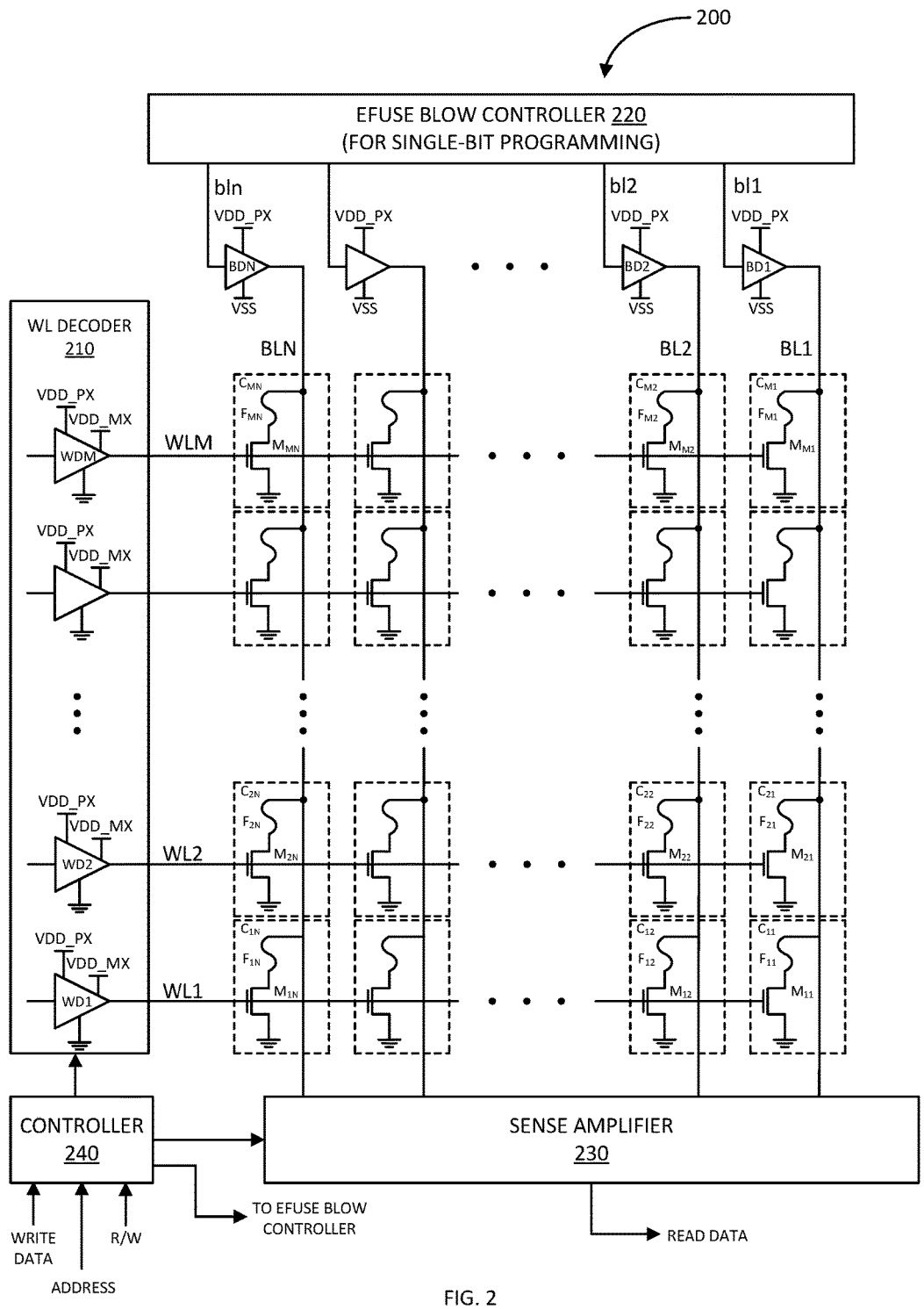
FIG. 2 illustrates a schematic diagram of an exemplary EFUSE OTP memory in accordance with another aspect of the disclosure.

FIG. 2 illustrates a schematic diagram of an exemplary EFUSE OTP memory 200 in accordance with another aspect of the disclosure. The OTP memory 200 includes a word line (WL) decoder 210, an EFUSE blow controller 220 (for single-bit programming), and an M×N two-dimensional array of memory cells $C_{11}$ to $C_{MN}$.

The WL decoder 210 includes M word line drivers WD1 to WDM with outputs coupled to word lines WL1 to WLM, respectively. As discussed further herein, for single-bit memory cell programming, a selected one of the word line drivers WD1 to WDN, which corresponds to the word line coupled to the single cell to be programmed, is configured to generate a programming voltage VDD_PX (e.g., 1.8V) on the corresponding word line. For reading an entire row of memory cells, a selected one of the word line drivers WD1 to WDN, which corresponds to the word line coupled to the cells to be read, is configured to generate a lower (core) reading voltage VDD_MX (e.g., 1.0V).

The EFUSE blow controller 220 is configured to generate bit line programming signals bl1 to bln as inputs to a set of bit line drivers BD1 to BDN, respectively. The bit line drivers BD1 to BDN are configured to generate a programming voltage VDD_PX (e.g., 1.8V) sufficient to perform a single-bit memory cell programming. The outputs of the bit line drivers BD1 to BDN are coupled to bit lines BL1 to BLN, respectively. Accordingly, to effectuate a single-bit memory cell programming, a selected one of the bit line programming signals bl1 to bln, which corresponds to the bit line coupled to the single memory cell to be programmed, is asserted to cause the corresponding one of the bit line drivers BD1 to BDN to generate the programming voltage VDD_PX (e.g., 1.8V) on the corresponding bit line.

The memory cells $C_{11}$ to $C_{MN}$ comprise field effect transistors (FETs) $M_{11}$ to $M_{MN}$ and fuse elements $F_{11}$ to $F_{MN}$, respectively. Each of the FETs $M_{11}$ to $M_{MN}$ may be configured as an n-channel metal oxide semiconductor (NMOS) FET. Each of the fuse elements $F_{11}$ to $F_{MN}$ may be configured as a thin metallization strip that is capable of being opened ("blown") when sufficient amount of current is driven through the metallization strip due to electromigration.

In each cell, the fuse element is coupled in series with the drain and source of the FET between the corresponding bit line and a voltage rail VSS (e.g., ground). The corresponding FET includes a gate coupled to the corresponding word line.

The single-bit programming operation of the EFUSE OTP memory 200 may be as follows: In this example, the programming of cell $C_{11}$ is exemplified. Programming of other cells operates in a similar manner. When programming of cell $C_{11}$ is to occur, which means that the corresponding fuse element $F_{11}$ of the cell $C_{11}$ is to be blown, the WL decoder 210 activates the word line driver WD1, coupled to the gate of the FET $M_{11}$ of the cell $C_{11}$, to generate a programming voltage VDD_PX (e.g., 1.8V). The other word line drivers WD2 to WDM of the WL decoder 210 are not activated during programming of cell $C_{11}$.

Additionally, the EFUSE blow controller 220 asserts bit line programming signal bl1 to cause the bit line driver BD1 to generate a programming voltage VDD_PX (e.g., 1.8V) on the bit line BL1 coupled to the cell $C_{11}$. As this is only single-bit programming, the EFUSE blow controller 220 does not assert the other bit line programming signals bl2 to bln corresponding to the other bit lines BL2 to BLN, respectively. The word line WL1 and bit line BL1 being driven to respective programming voltages VDD_PX (e.g., 1.8V) produce sufficient current (e.g., 10-15 milliamps (ma)) through the fuse element $F_{11}$ and the FET $M_{11}$, which causes the fuse element $F_{11}$ to blow.

A memory cell with a blown fuse element may be assigned a particular logic level, such as a logic one (1), whereas a memory cell with its fuse element not having been blown may be assigned to the opposite logic level, such as a logic zero (0). Following the programming of cell $C_{11}$, the next cell $C_{12}$ may be programmed if the corresponding bit should be, for example, a logic one (1). In this example, the maximum number of cells per row that may be programmed is N, which could be, for example, 64.

An issue that arises with the EFUSE OTP memory 200 is stress induced on the FETs exposed to the programming voltage VDD_PX. For example, when cell $C_{11}$ is being programmed, the activated word line WL1 at the programming voltage (e.g., 1.8V) induces stress on the FETs $M_{12}$ to $M_{1N}$ of the remaining cells $C_{12}$ to $C_{1N}$, even though the corresponding bit lines BL2-BLN are grounded. If the FETs of the cells are designed to handle the programming voltage, such as by configuring the cells with thicker oxides as in input/output (I/O) devices, this would not be an issue. However, configuring the OTP memory 200 with thicker-oxide devices would require substantial IC area to implement the OTP memory 200, which is generally undesirable.

Instead, to reduce the IC area needed to implement the OTP memory 200, the FETs of the cells may be configured as core devices. As core devices, each of the FETs may only be rated to handle, for example, a continuous maximum voltage of 1.2V for a 28 nm device or 0.8V for a 10 nm device. Accordingly, to attempt to minimize stress on the FETs by subjecting them to a programming voltage (e.g., 1.8V) above their rated voltage, the programming time is made very short (e.g., 10 microseconds (μs)), only long enough to blow the fuse element).

The reliability of any of the FETs is a function of the programming voltage applied to it and the time duration of the application of the programming voltage. Taking the example where the programming duration is 10 μs, if the number N of cells in each row is 64, then the maximum duration in which any of the corresponding FETs are subjected to the programming voltage is 640 μs. This may be the case where all the fuse elements of the cells in the row are blown. Such lengthy exposure to the programming voltage may cause permanent damage to the FETs due to, for example, current tunneling through the gate oxides or other adverse effects.

Thus, there is a need for an OTP memory that uses small core devices to reduce the amount of IC area needed to implement the memory, and at the same time, reduce the amount of stress on the FETs due to the high programming voltage.

Figure 3:
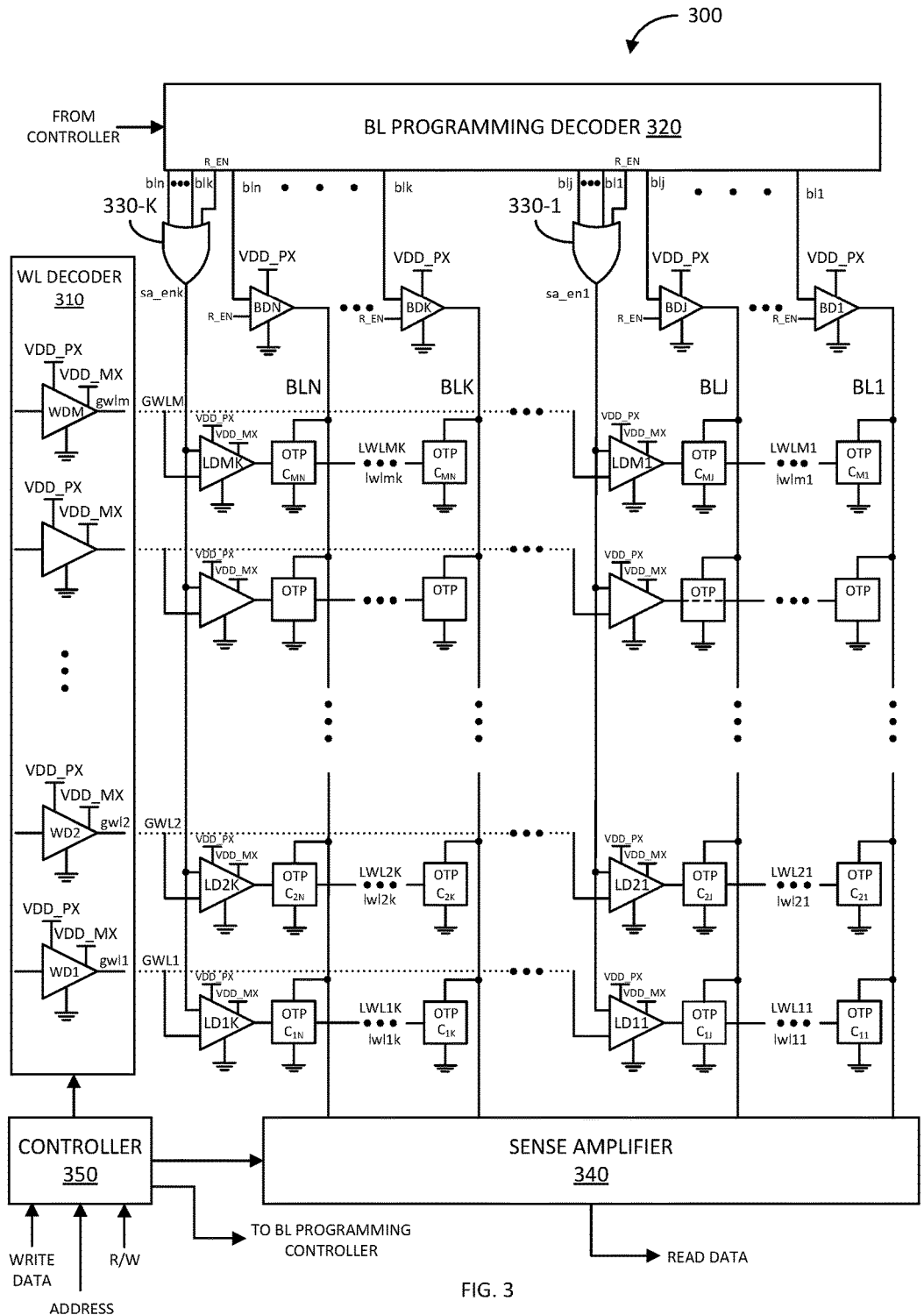
FIG. 3 illustrates a schematic diagram of an exemplary OTP memory in accordance with another aspect of the disclosure.

FIG. 3 illustrates a schematic diagram of an exemplary OTP memory 300 in accordance with another aspect of the disclosure. In summary, the memory cells of the OTP memory 300 are partitioned into subarrays along the word line dimension to reduce the number of FETs subjected to the word line programming voltage VDD_PX. Each of the cells of the OTP memory 300 may be configured as an EFUSE memory cell, an antifuse memory cell, or other type of OTP memory cell.

In particular, the OTP memory 300 includes a subarray of OTP memory cells $C_{11}$ to $C_{MJ}$ coupled to bit lines BL1 to BLJ and local word lines LWL11 to LWLM1. In particular, memory cells $C_{11}$ to $C_{1J}$ are coupled to local word line LWL11 and bit lines BL1 to BLJ, respectively. Similarly, memory cells $C_{21}$ to $C_{2J}$ are coupled to local word line LWL21 and bit lines BL1 to BLJ, respectively. And, memory cells $C_{M1}$ to $C_{MJ}$ are coupled to local word line LWLM1 and bit lines BL1 to BLJ, respectively.

The subarray of memory cells $C_{11}$ to $C_{MJ}$ include local (word line) drivers LD11 to LDM1 with outputs coupled to the local word lines LWL11 to LWLM1, respectively. The local drivers LD11 to LDM1 are configured to generate local word line signals lwl11 to lwlm1 on the local word lines LWL11 to LWLM1, respectively. The local drivers LD11 to LDM1 include respective first inputs coupled to global word lines GWL1 to GLWM, respectively. The local drivers LD11 to LDM1 further include respective second inputs coupled to an output of a multiple-input OR-gate circuit 330-1. Bit line programming signals bl1 to blj, associated with activating the respective bit lines BL1 to BLJ for programming purposes, are applied to the inputs of the multiple-input OR-gate circuit 330-1. Additionally, a read enable signal R_EN is applied to an input of the multiple-input OR-gate 330-1.

The OTP memory 300 includes at least another subarray of memory cells $C_{1K}$ to $C_{MN}$ coupled to bit lines BLK to BLN and local word lines LWL1K to LWLMK. In particular, memory cells $C_{1K}$ to $C_{1N}$ are coupled to local word line LWL1K and bit lines BLK to BLN, respectively. Similarly, memory cells $C_{2K}$ to $C_{2N}$ are coupled to local word line LWL2K and bit lines BLK to BLN, respectively. And, memory cells $C_{MK}$ to $C_{MN}$ are coupled to local word line LWLMK and bit lines BLK to BLN, respectively.

The subarray of memory cells $C_{1K}$ to $C_{MN}$ include local (word line) drivers LD1K to LDMK with outputs coupled to the local word lines LWL1K to LWLMK, respectively. The local drivers LD1K to LDMK are configured to generate local word line signals lwl1k to lwlmk on the local word lines LWL1K to LWLMK, respectively. The local drivers LD1K to LDMK include respective first inputs coupled to global word lines GWL1 to GLWM, respectively. The local drivers LD1K to LDMK further include respective second inputs coupled to an output of a multiple-input OR-gate circuit 330-K. Bit line programming signals blk to bln, associated with activating the respective bit lines BLK to BLN for programming purposes, are applied to the inputs of the multiple-input OR-gate circuit 330-K. Additionally, the read enable signal R_EN is applied to an input of the multiple-input OR-gate 330-K.

The OTP memory 300 further includes a word line (WL) decoder 310 including M number of global word line drivers WD1 to WDM with outputs coupled to global bit lines GWL1 to GWLM, respectively. The word line drivers WD1 to WDM are configured to generate global word line signals gwl1 to gwlm on the global word lines GWL1 to GWLN, respectively. During programming, a selected one of the global word line signals gwl1 to gwlm is set to a programming voltage VDD_PX (e.g., 1.8V). During reading, a selected one of the global word line signals gwl1 to gwlm is set to a reading (core) voltage VDD_MX (e.g., 1.0V).

The OTP memory 300 also includes a BL programming decoder 320. The BL programming decoder 320 generates bit line programming signals bl1 to blj, which are applied to the respective inputs of bit line drivers BD1 to BDJ, and to the inputs of the multiple-input OR-gate circuit 330-1. Additionally, the BL programming decoder 320 generates the read enable signal R_EN applied to other respective inputs of the bit line drivers BD1 to BDJ, and to another input of OR-gate circuit 330-1. In response to the ORed set of bit line programming signals bl1 to blj and R_EN, the multiple-input OR-gate circuit 330-1 generates a subarray enable signal sa_en1.

The bit line drivers BD1 to BDJ include outputs coupled to bit lines BL1 to BLJ, respectively. The bit line drivers BD1 to BDJ are configured to generate a programming voltage VDD_PX (e.g., 1.8V) sufficient to program the selected memory cell. During programming, a selected one of the bit line drivers BD1 to BDJ is configured to generate the programming voltage VDD_PX, and the remaining bit line drivers each generates a logic low voltage VSS (e.g., ground) to prevent programming of unintended cells. During reading, all of the bit line drivers BD1 to BDJ are tri-stated (e.g., configured to produce sufficiently high impedances at their respective outputs so as not to adversely affect the reading of the memory cells by a sense amplifier 340, as discussed further herein).

Similarly, the BL programming decoder 320 generates at least another set of bit line programming signals blk to bln, which are applied to the respective inputs of bit line drivers BDK to BDN, and to inputs of the multiple-input OR-gate circuit 330-K. Additionally, the BL programming decoder 320 generates the read enable signal R_EN applied to other respective inputs of the bit line drivers BDK to BDN, and to another input of OR-gate circuit 330-K. In response to the ORed set of bit line programming signals blk to bln and R_EN, the multiple-input OR-gate circuit 330-K generates a subarray enable signal sa_enk.

The bit line drivers BDK to BDN include outputs coupled to bit lines BLK to BLN, respectively. The bit line drivers BDK to BDN are configured to generate a programming voltage VDD_PX (e.g., 1.8V) sufficient to program the selected memory cell. During programming, a selected one of the bit line drivers BDK to BDN is configured to generate the programming voltage VDD_PX, and the remaining bit line drivers each generates a logic low voltage VSS (e.g., ground) to prevent programming of unintended cells. During reading, all of the bit line drivers BDK to BDN are tri-stated (e.g., configured to produce sufficiently high impedances at their respective outputs so as not to adversely affect the reading of memory cells by the sense amplifier 340).

As mentioned above, the OTP memory 300 further includes a sense amplifier 340 coupled to the bit lines BD1 to BDN. During a reading operation, the sense amplifier 340 is configured to read data from a row of memory cells at a time. The sense amplifier 340 is configured to output the read data.

The OTP memory 300 further includes a controller 350 having inputs to receive write data, address, and read/write (R/W) control signals. Based on these input signals, the controller 350 is configured to control WL decoder 310, the BL programming decoder 320, and the sense amplifier 340. For example, based on the address, the write data, and the R/W control signal indicating a programming operation, the controller 350 controls the WL decoder 310 to produce a programming voltage VDD_PX on a selected global word line corresponding to the memory cell to be programmed, and controls the BL programming decoder 320 to produce the programming voltage VDD_PX on the selected bit line coupled to the memory cell to be programmed.

Based on the address and the R/W control signal indicating a reading operation, the controller 350 controls the WL decoder 310 to produce a reading (core) voltage VDD_MX on a selected global word line corresponding to a row of the memory cells to be read, and controls the sense amplifier 340 to sense voltages and/or currents on the bit lines to read the corresponding data. During a reading operation, the controller 350 also controls the BL programming decoder 320 to assert the read enable signal R_EN, which tri-states the bit line drivers BD1 to BDN so that they produce sufficiently high impedances at their respective outputs so as not to adversely affect the reading operation performed by the sense amplifier 340. Additionally, the asserted read enable signal R_EN causes the OR-gate circuits 330-1 to 330-K to generate asserted subarray enable signals sa_en1 to sa_enk, respectively.

The single-bit programming operation of the OTP memory 300 is as follows: In this example, the programming (generally accessing) of cell $C_{11}$ is exemplified. Programming of other cells operates in a similar manner.

The controller 350 receives the address indicating that memory cell C11 is to be programmed, the write data indicating a logic one (1) so that the programming voltage to-be-generated permanently alters the state of memory cell $C_{11}$ (e.g., blows a fuse in the case of an EFUSE cell), and the R/W control signal indicating that the memory operation to be performed is a programming (writing) operation. In response to receiving these signals, the controller 350 sends the corresponding control signals to the WL decoder 310 and the BL programming decoder 320. In response, the WL decoder 310 causes word line driver WD1 to generate a write-asserted global word line signal gwl1 (e.g., setting it to the programming voltage VDD_PX). The write-asserted global word line signal gwl1 is applied to the respective first inputs of local drivers LD11 to LD1K. The WL decoder 310 also causes the remaining word line drivers WD2 to WDM to generate write-de-asserted global word line signals gwl2 to gwlm (e.g., setting them to VSS (e.g., ground)) to prevent programming of unintended memory cells.

Additionally, in response to the controller 350, the BL programming decoder 320 generates an asserted bit line programming signal bl1 (e.g., setting it to the programming voltage VDD_PX) to cause the bit line driver BD1 to generate the programming voltage VDD_PX (e.g., 1.8V) on the bit line BL1 coupled to the cell $C_{11}$. The asserted bit line programming signal bl1, being applied to one of the inputs of OR-gate circuit 330-1, causes the OR-gate circuit 330-1 to assert the subarray enabled signal sa_en1 (e.g., setting it to the programming voltage VDD_PX). The asserted subarray enabled signal sa_en1 is applied to the respective second inputs of local drivers LD11 to LDM1. The BL programming decoder 320 generates de-asserted bit line signals b12 to bln (e.g., setting them to VSS (e.g., ground)) to cause the corresponding bit line drivers BD2 to BDN to generate de-asserted signals (e.g., setting them to VSS (e.g., ground)) to prevent unwanted programming of unintended memory cells. As none of the bit line programming signals blk to bln applied to the OR-gate circuit 330-K are asserted, the OR-gate circuit 330-K generates a de-asserted subarray enable signal sa_enk.

A local driver generates a write-asserted signal at the programming voltage VDD_PX (e.g., 1.8V) in response to both of its inputs receiving asserted signals. Thus, in this example, as the first input of the local driver LD11 receives the asserted global word line signal gwl1, and the second input of the local driver LD11 receives the asserted subarray enabled signal sa_en1, the local driver LD11 generates a write-asserted local word line signal lwl11 at the programming voltage VDD_PX (e.g., 1.8V). Since bit line driver BD1 also generates a programming voltage VDD_PX (e.g., 1.8V), the cell $C_{11}$ is programmed.

During the programming of cell $C_{11}$, the remaining local drivers do not generate write-asserted local word line signals lwl12 to lwlmk, as their respective inputs do not receive two asserted signals. For instance, the second input of local driver LD1K receives a de-asserted subarray enable signal sa_enk, as the memory cell $C_u$ to be programmed is not in the same subarray as local driver LD1K. Similarly, the respective first inputs of local drivers LD21 to LDM1 receive respective de-asserted global word line signals gwl2 to gwlm, as the memory cell $C_u$ to be programmed is not in the rows corresponding to global word line signals gwl2 to gwlm. The remaining local drivers LD2K to LDMK also receive de-asserted signals at both of their respective inputs because these local drivers do not belong to the subarray of the memory cell $C_{11}$ to be programmed, and also are not coupled to the global word line associated with memory cell $C_{11}$. Accordingly, these remaining local drivers generate de-asserted local word line signals (e.g., at VSS (e.g., ground)) so as to prevent programming of unintended memory cells.

Although the programming of a single cell is exemplified, it shall be understood that one or more cells (e.g., such as one or more of cells $C_u$ to $C_u$) coupled to an enabled local driver (e.g., local driver LD11) may be programmed. In such case, the BL programming decoder 320 asserts one or more bit lines programming signals (e.g., such as one or more of bl1 to blj) to cause the corresponding one or more bit line drivers (e.g., such as one or more of BD1 to BDJ) to generate one or more programming voltages VDD_PX, respectively.

Thus, a concept behind the OTP memory 300 is to have a local driver generate a write-asserted local word line signal at a programming voltage in response to receiving an asserted global word line signal via a corresponding global word line and receiving an asserted subarray enable signal via a corresponding multiple-input OR-gate circuit.

An advantage of the OTP memory 300 is that the programming voltage VDD_PX is applied to less FETs; thereby reducing the stress on the FETs. For example, if the number of cells coupled to a local word line is eight (8) (e.g., a memory array of 64 cells per row being divided into eight (8) subarrays), the maximum number of times that each of the cells may be subjected to the programming voltage is eight (8), as compared to 64 times for the cells of OTP 200. If, for example, the programming duration is 10 μs, then the maximum duration for which a cell in OTP memory 300 may be subjected to the programming voltage is 80 μs, as compared to 640 μs for the cells of OTP memory 200.

Thus, the cells of OTP memory 300 are subjected to substantially less stress during programming, which helps prevent damage to the FETs of the cells. This allows for the OTP memory 300 to be implemented with core devices to reduce IC area to implement the same memory capacity as compared to that of a memory that uses thicker oxide devices, such as I/O devices.

The reading operation of the OTP memory 300 is as follows: In this example, the reading (generally accessing) of data from the row of memory cells $C_{11}$ to $C_{1N}$ is exemplified. The reading of data from other rows of memory cells operates in a similar manner.

The controller 350 receives the address signal indicating that data in the row of memory cells $C_{11}$ to $C_{1N}$ is to be read, and the R/W control signal indicating that the memory operation to be performed in a reading operation (in a reading operation, the controller 350 may ignore the write data signal). In response to receiving these signals, the controller 350 sends the corresponding control signals to the WL decoder 310, the BL programming decoder 320, and the sense amplifier 340.

In response, the WL decoder 310 causes word line driver WD1 to generate a read-assert global word line signal gwl1 (e.g., setting it to a reading (core) voltage VDD_MX). The read-asserted global word line signal gwl1 is applied to the respective first inputs of local drivers LD11 to LD1K. The WL decoder 310 also causes the remaining word line drivers WD2 to WDM to generate de-asserted global word line signals gwl2 to gwlm (e.g., setting them to VSS (e.g., ground)) so as to prevent memory cells not intended to be read to interfere with the reading of memory cells $C_{11}$ to $C_{iN}$.

Additionally, in response to the controller 350, the BL programming decoder 320 generates an asserted read enable signal R_EN to configure the bit line drivers BD1 to BDN in a tri-state configuration (e.g., to produce sufficiently high impedances at their respective outputs so as not to interfere with the reading operation performed by the sense amplifier 340). The asserted read enable signal R_EN also causes all of the OR-gate circuits 330-1 to 330-K to generate asserted subarray enable signals sa_en1 to sa_enk, respectively.

Similarly, a local driver generates a read-asserted local word line signal at the reading (core) voltage VDD_MX (e.g., 1.0V) in response to both of its inputs receiving asserted signals. Thus, in this example, as the respective first inputs of local drivers LD11 to LD1K receive the asserted global word line signal gwl1, and the respective second inputs of local drivers LD11 to LD1K receive the asserted subarray enabled signals sa_en1 to sa_enk, the local drivers LD11 to LD1K generate asserted local word line signals lwl11 to lwl1k at the reading (core) voltage VDD_MX. The sense amplifier 340 senses currents and/or voltages on the bit lines BD1 to BDK to determine the data stored in memory cells $C_{11}$ to $C_{1K}$, respectively.

During reading of the first row of memory cells $C_{11}$ to $C_{1N}$, the local drivers associated with the remaining rows of memory cells do not generate read-asserted local word line signals as their respective first inputs receive de-asserted global word line signals gwl2 to glwn. In response to the de-asserted signals at their respective first inputs, these remaining local drivers generate de-asserted local word line signals at VSS potential (e.g., (e.g., ground)) to prevent interference of the reading of data from memory cells $C_{11}$ to $C_{1N}$ from the remaining memory cells $C_{21}$ to $C_{MN}$.

Figure 4:
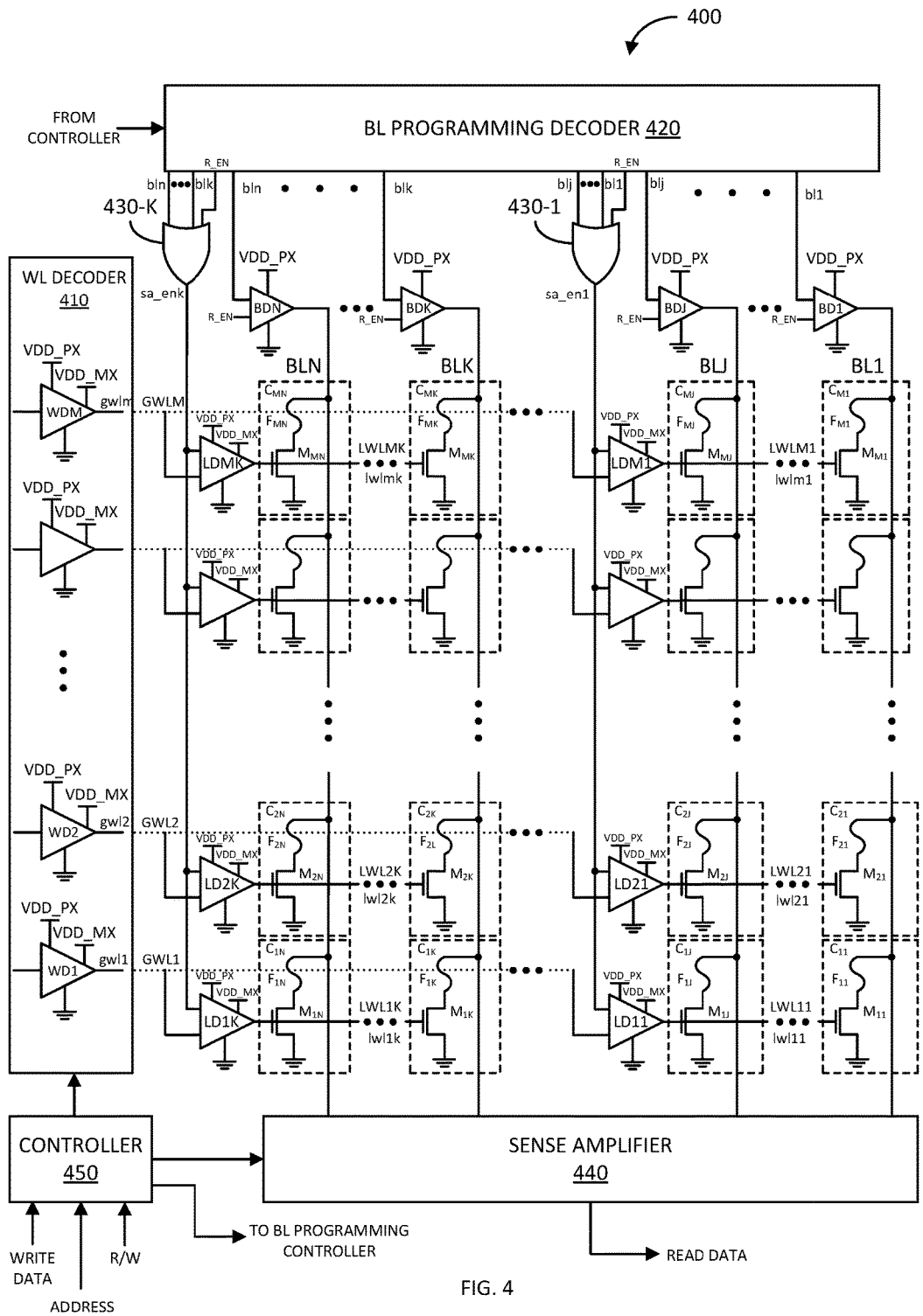
FIG. 4 illustrates a schematic diagram of an exemplary EFUSE OTP memory in accordance with another aspect of the disclosure.

FIG. 4 illustrates a schematic diagram of another exemplary OTP memory 400 in accordance with an aspect of the disclosure. The OTP memory 400 is a more detailed implementation of OTP memory 300 previously discussed. That is, OTP memory 400 includes substantially similar elements as OTP memory 300, including a WL decoder 410, a BL programming decoder 420, a sense amplifier 440, and a controller 450. Additionally, the OTP memory 400 includes multiple-input OR-gate circuits 430-1 to 430-K, bit line drivers BD1 to BDN, local (word line) drivers LD11 to LDMK, and memory cells $C_{11}$ to $C_{MN}$. The operation of the aforementioned elements of OTP memory 400 are configured to operate in substantially the same manner as corresponding elements of OTP memory 300, previously discussed.

In OTP memory 400, each of the memory cells $C_{11}$ to $C_{MN}$ is configured as an EFUSE-type memory cell. That is, each memory cell in OTP memory 400 includes a fuse element and a FET. More specifically, memory cells $C_{11}$ to $C_{1J}$ include fuse elements $F_{11}$ to $F_{1J}$ coupled in series with FETs $M_{11}$ to $M_{1J}$ between bit lines BL1 to BLJ and VSS rail, respectively. The gates of FETs $M_{11}$ to $M_{1J}$ are coupled to an output of local driver LD11. Similarly, memory cells $C_{21}$ to $C_{2J}$ include fuse elements $F_{21}$ to $F_{2J}$ coupled in series with FETs $M_{21}$ to $M_{2J}$ between bit lines BL1 to BLJ and VSS rail, respectively. The gates of FETs $M_{21}$ to $M_{2J}$ are coupled to an output of local driver LD21. In a like manner, memory cells $C_{M1}$ to $C_{MJ}$ include fuse elements $F_{M1}$ to $F_{MJ}$ coupled in series with FETs $M_{M1}$ to $M_{MJ}$ between bit lines BL1 to BLJ and VSS rail, respectively. The gates of FETs $M_{M1}$ to $M_{MJ}$ are coupled to an output of local driver LDM1.

Similarly, memory cells $C_{1K}$ to $C_{1N}$ include fuse elements $F_{1K}$ to $F_{1N}$ coupled in series with FETs $M_{1K}$ to $M_{1N}$ between bit lines BLK to BLN and VSS rail, respectively. The gates of FETs $M_{1K}$ to $M_{1N}$ are coupled to an output of local driver LD1K. Similarly, memory cells $C_{2K}$ to $C_{2N}$ include fuse elements $F_{2K}$ to $F_{2N}$ coupled in series with FETs $M_{2K}$ to $M_{2N}$ between bit lines BLK to BLN and VSS rail, respectively. The gates of FETs $M_{2K}$ to $M_{2N}$ are coupled to an output of local driver LD2K. In a like manner, memory cells $C_{MK}$ to $C_{MN}$ include fuse elements $F_{MK}$ to $F_{MN}$ coupled in series with FETs $M_{MK}$ to $M_{MN}$ between bit lines BLK to BLN and VSS rail, respectively. The gates of FETs $M_{MK}$ to $M_{MN}$ are coupled to an output of local driver LDMK.

The programming of an EFUSE memory cell has been previously discussed herein. That is, a selected bit line driver is configured to generate a programming voltage VDD_PX on the bit line coupled to the memory cell. A selected local word line driver is configured to generate a write-asserted local word line signal at the programming voltage VDD_PX on the local word line coupled to the memory cell. The programming voltages applied to the drain and gate of the corresponding FET produces sufficient current to blow the corresponding fuse element of the cell.

The reading of data from a row of EFUSE memory cells operates as follows: The sense amplifier discharges all of the bit lines. A selected set of local word line drivers, corresponding to a row of cells, are configured to generate read-asserted local word line signals at the reading (core) voltage VDD_MX on the corresponding local word lines coupled to the memory cells. Accordingly, the reading (core) voltage VDD_MX is applied to the gates of the FETs of the memory cells so as to enable the cells for reading.

The sense amplifier then gradually raises the voltages on the bit lines to detect currents in the bit lines. The sense amplifier gradually raised the voltages so as to prevent unintended programming (e.g., blowing the fuse element) of memory cells. If the bit line current is below a threshold, then the fuse element of the corresponding memory cell is blown, and the sense amplifier reads the corresponding data as a logic one (1). If the current is above the threshold, then the fuse element of the corresponding memory cell is not blown, and the sense amplifier reads the corresponding data as a logic zero (0). The sense amplifier outputs the read data for use by one or more external devices.

Figure 5:
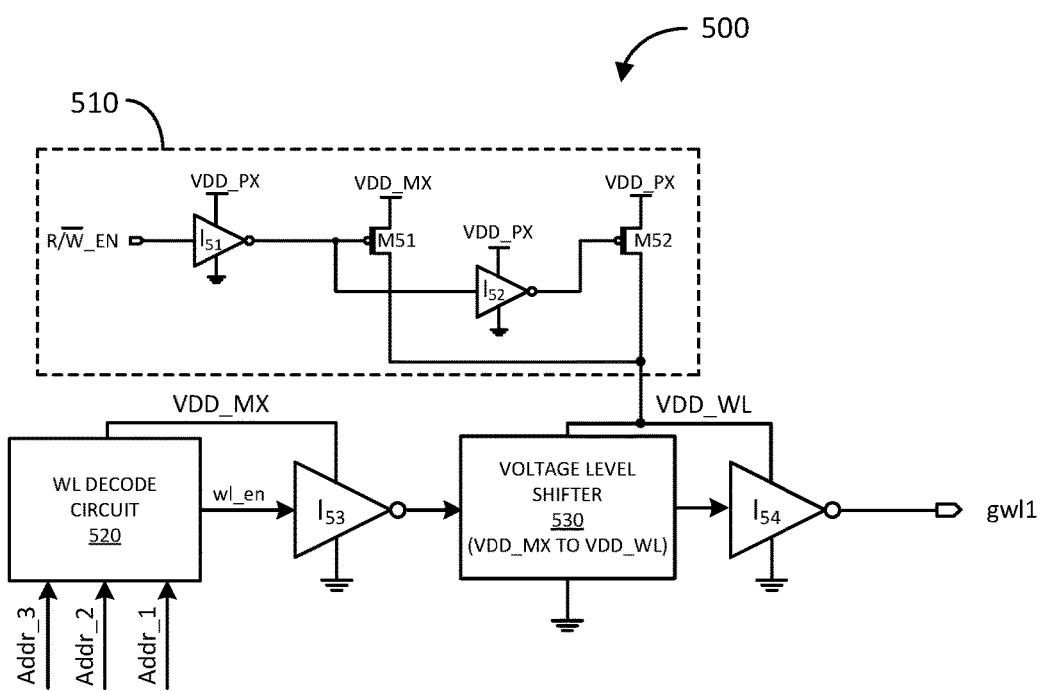
FIG. 5 illustrates a schematic diagram of an exemplary global word line (WL) driver in accordance with another aspect of the disclosure.

FIG. 5 illustrates a schematic diagram of an exemplary global word line driver 500 in accordance with another aspect of the disclosure. The global word line driver 500 is an example of a detailed implementation of any of the global word line drivers WD1 to WDM of the OTP memories previously discussed. For ease of description, the global word line driver 500 is described as a detailed implementation of global word line driver WD1.

In particular, the global word line driver 500 includes a power multiplexer ("power mux") 510, a word line (WL) decode circuit 520, an inverter $I_{53}$, a voltage level shifter 530, and an inverter $I_{54}$. The power mux 510, in turn, includes an inverter $I_{51}$, a p-channel metal oxide semiconductor (PMOS) FET M51, an inverter $I_{52}$, and a PMOS M52.

With regard to the power mux 510, the inverter $I_{51}$ includes an input configured to receive a read/not-write enable signal R/$\overline{W}$_EN based on a control signal received from controller 350 or 450 of OTP memory 300 or 400, respectively. The inverter $I_{51}$ includes an output coupled to a gate of PMOS M51 and an input of inverter $I_{52}$. The source and drain of PMOS M51 are coupled between a reading voltage domain rail VDD_MX and an output domain rail VDD_WL of the power mux 510. The inverter $I_{52}$ includes an output coupled to a gate of PMOS M52. The source and drain of PMOS M52 are coupled between a programming voltage domain rail VDD_MX and the output domain rail VDD_WL of the power mux 510. As illustrated, the inverters $I_{51}$ and $I_{52}$ are powered by a programming voltage domain VDD_PX.

The WL decode circuit 520 receives address bits Addr_1 to Addr_3 based on a control signal received from controller 350 or 450 in OTP memory 300 or 400, previously discussed. The WL decode circuit 520 generates a word line enable signal wl_en based on the address bits Addr_1 to Addr_3. For example, the WL decode circuit 520 asserts the word line enable signal wl_en based on a unique value (e.g., 000) of the address bits Addr_1 to Addr_3 that is configured to assert the corresponding global word line signal for programming or reading purpose. The word line enable signal wl_en is applied to an input of the inverter $I_{53}$. Both the WL decode circuit 520 and inverter $I_{53}$ are powered by a core voltage domain VDD_MX.

The output of the inverter $I_{53}$ is coupled to an input of the voltage level shifter 530. The voltage level shifter 530 includes an output coupled to an input of inverter $I_{54}$. The inverter $I_{54}$ outputs the corresponding global word line signal gwl1. The voltage level shifter 530 and inverter $I_{54}$ are powered by the output voltage domain VDD_WL of the power mux 510.

In operation, during programming, the read/not-write enable signal R/$\overline{W}$_EN is set to a logic low voltage (e.g., at VSS). In response, the inverter $I_{51}$ generates a logic high voltage (e.g., at VDD_PX). This causes PMOS M51 to turn off and inverter $I_{52}$ to output a logic low voltage (e.g., at VSS). The logic low voltage outputted by inverter $I_{52}$ causes PMOS M52 to turn on. Accordingly, the power mux 510 generates the output voltage domain VDD_WL at the programming voltage VDD_PX.

Based on the unique value of the address bits Addr_1 to Addr_3 (e.g., 000), the WL decode circuit 520 generates an asserted word line enable signal wl_en as a logic high voltage (e.g., at VDD_MX). In response, the inverter $I_{53}$ generates a logic low voltage (e.g., at VSS). The voltage level shifter 530 shifts the input logic low voltage from the VDD_MX voltage domain to the VDD_WL voltage domain, which the power mux 510 has set it to the VDD_PX voltage domain. Accordingly, the voltage level shifter 530 generates a logic low voltage (e.g., VSS). In response, the inverter $I_{54}$ generates a write-asserted global word line signal gwl1 as a logic high voltage in the programming voltage domain VDD_PX.

During a reading operation, the read/not-write enable signal R/$\overline{W}$_EN is set to a logic high voltage (e.g., at VDD_PX). In response, the inverter $I_{51}$ generates a logic low voltage (e.g., at VSS). This causes PMOS M51 to turn on and inverter $I_{52}$ to output a logic high voltage (e.g., at VDD_PX). The logic high voltage outputted by inverter $I_{52}$ causes PMOS M52 to turn off. Accordingly, the power mux 510 generates the output voltage domain VDD_WL at the reading (core) voltage VDD_MX.

Based on the unique value of the address bits Addr_1 to Addr_3 (e.g., 000), the WL decode circuit 520 generates an asserted word line enable signal wl_en as a logic high voltage (e.g., at VDD_MX). In response, the inverter $I_{53}$ generates a logic low voltage (e.g., at VSS). The voltage level shifter 530 shifts the input logic low voltage from the VDD_MX voltage domain to the VDD_WL voltage domain, which the power mux 510 has set it to the VDD_MX voltage domain. Accordingly, the voltage level shifter 530 generates a logic low voltage (e.g., VSS). In response, the inverter $I_{54}$ generates a read-asserted global word line signal gwl1 as a logic high voltage in the reading (core) voltage domain VDD_MX.

When the global word line driver 500 is idle (e.g., generates a de-asserted global word line signal gwl1), the WL decode circuit 520 generates a de-asserted word line enable signal wl_en (e.g., logic low signal) based on values of the address bits Addr_1 to Addr_3 (e.g., not 000) that do not produce an asserted global word line signal gwl1. In response, the inverter $I_{53}$ generates a logic high voltage (e.g., at VDD_MX). The voltage level shifter 530 generates a logic high voltage in the VDD_WL voltage domain, which could be at VDD_PX or VDD_MX based on the configuration of the power mux 510. In response, the inverter $I_{54}$ generates a de-asserted global word line signal gwl1 as a low logic voltage (e.g., at VSS).

Figure 6:
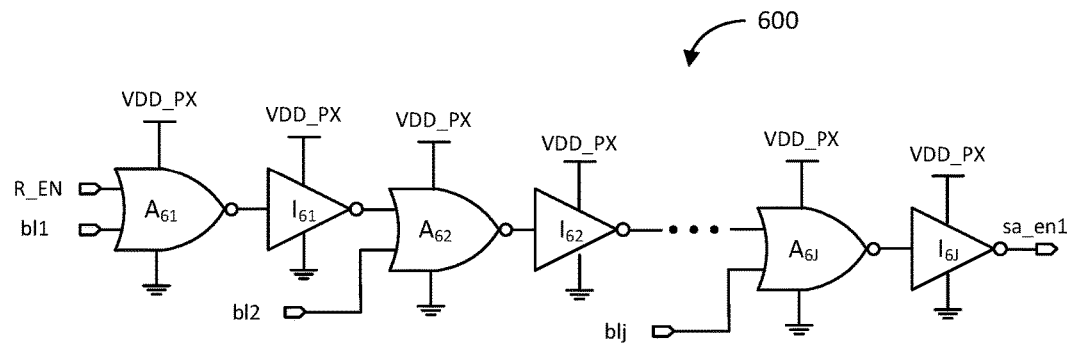
FIG. 6 illustrates a schematic diagram of an exemplary multiple-input OR-gate circuit in accordance with another aspect of the disclosure.

FIG. 6 illustrates a schematic diagram of an exemplary multiple-input OR-gate circuit 600 in accordance with another aspect of the disclosure. The OR-gate circuit 600 is an example of a detailed implementation of any of the multiple-input OR-gate circuits 330-1 to 330-K and 430-1 to 430-K of OTP memories 300 and 400, previously discussed. For ease of description, the multiple-input OR-gate circuit 600 is described as being a detailed implementation of multiple-input OR-gate circuit 330-1.

The OR-gate circuit 600 includes a set of cascaded NOR-gate and inverter pairs $A_{61}$-$I_{61}$, $A_{62}$-$I_{62}$ to $A_{6J}$-$I_{6J}$. The number of NOR-gate and inverter pairs is equal to the number of bit lines in a subarray. For example, with reference to OTP memory 300 and 400, the subarray including memory cells C11 to CMJ includes J bit lines. The first NOR-gate $A_{61}$ includes inputs for receiving the read enable signal R_EN and the first bit line programming signal bl1. The second NOR-gate $A_{62}$ includes input for receiving the output of the first inverter $I_{61}$ and the second bit line programming signal bl2. The Jth NOR-gate $A_{6J}$ includes input for receiving the output of the previous inverter $I_{6(J-1)}$ and the Jth bit line programming signal blj. All of the NOR-gates $A_{61}$-$A_{6J}$ and inverters I61-A6J are powered by the programming voltage VDD_PX.

In operation, during programming of a memory cell coupled to a selected one of bit lines BD1 to BDJ, the corresponding bit line programming signal is asserted (e.g., at VDD_PX). This causes the multi-input OR-gate circuit 600 to generate an asserted subarray enable signal sa_en1. As previously discussed, the asserted subarray enable signal sa_en1 is applied to the respective second inputs of the local drivers LD11 to LDM1. Also, as previously discussed, the global word line associated with the memory cell to be programmed is asserted, which is applied to a corresponding one of these local drivers LD11 to LDM1. Such local driver receives the asserted global word line signal and the asserted subarray enable signal, and thus, generates a write-asserted local word line signal at the programming voltage VDD_PX to program the selected memory cell.

As previously discussed, during a reading operation, the read enable signal R_EN is asserted (e.g., set to the programming voltage VDD_PX). This causes the multi-input OR-gate circuit 600 to generate an asserted subarray enable signal sa_en1 (e.g., at VDD_PX). As previously discussed, all the other multiple-input OR-gate circuits of the OTP memory generate asserted subarray enable signals. The local drivers that respectively receive the asserted subarray enable signals as well as the asserted global word line signal generate read-asserted local word line signals at the reading (core) voltage VDD_MX to effectuate the reading of the data from the memory cells by the sense amplifier.

Figure 7:
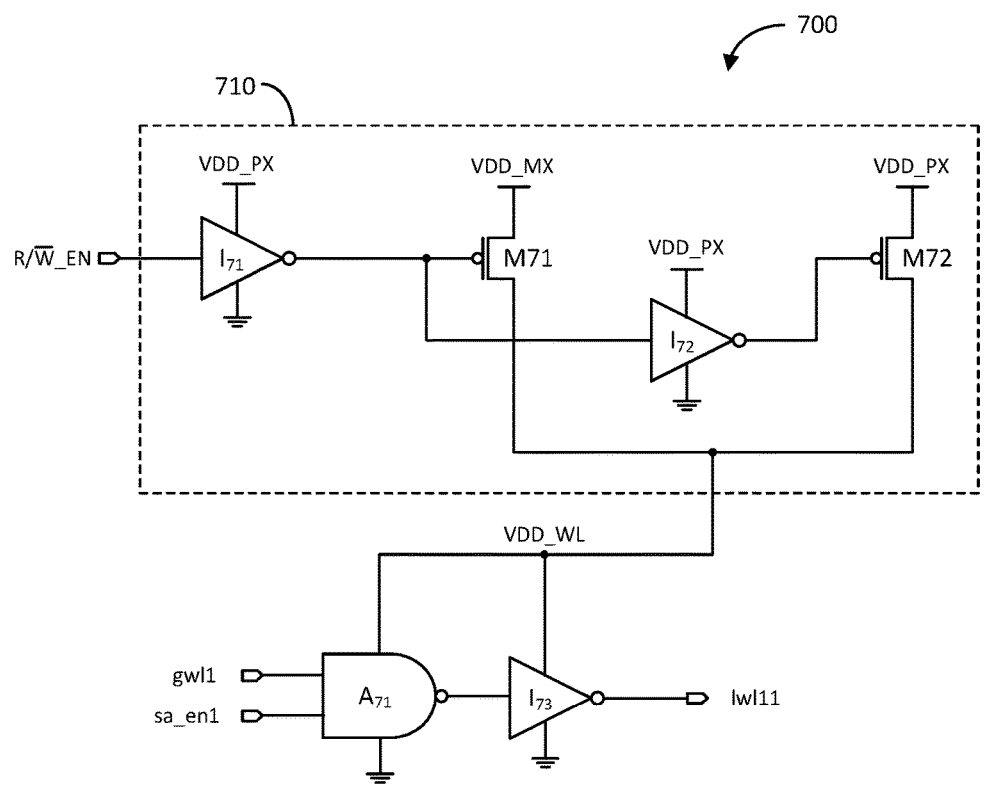
FIG. 7 illustrates a schematic diagram of an exemplary local word line (LWL) driver in accordance with another aspect of the disclosure.

FIG. 7 illustrates a schematic diagram of an exemplary local (word line) driver 700 in accordance with another aspect of the disclosure. The local driver 700 is an example of a detailed implementation of any of the local drivers LD11 to LDMN of OTP memories 300 and 400, previously discussed. For ease of description, the local driver 700 is described as a detailed implementation of local driver LD11.

In particular, the local driver 700 includes a power multiplexer ("power mux") 710, a NAND gate $A_{71}$, and an inverter $I_{73}$. The power mux 710, in turn, includes an inverter $I_{71}$, a PMOS M71, an inverter $I_{72}$, and a PMOS M72.

With regard to the power mux 710, the inverter $I_{71}$ includes an input configured to receive a read/not-write enable signal R/W̄_EN based on a control signal generated by controller 350 or 450 of OTP memory 300 or 400. The inverter $I_{71}$ includes an output coupled to a gate of PMOS M71 and an input of inverter $I_{72}$. The source and drain of PMOS M71 are coupled between a reading voltage domain rail VDD_MX and an output voltage domain rail VDD_WL of the power mux 710. The inverter $I_{72}$ includes an output coupled to a gate of PMOS M72. The source and drain of PMOS M72 are coupled between a programming voltage domain rail VDD_MX and the output voltage domain rail VDD_WL of the power mux 710. As illustrated, the inverters $I_{71}$ and $I_{72}$ are powered by the programming voltage VDD_PX.

The NAND-gate $A_{71}$ includes a first input to receive the global word line signal gwl1 from the corresponding global word line GWL1 and a second input to receive the subarray enable signal sa_en1 from the multiple-input OR-gate circuit 330-1 or 430-1. The output of the NAND-gate $A_{71}$ is coupled to an input of inverter $I_{73}$. The inverter $I_{73}$ generates the local word line signal lwl11. The AND-gate $A_{71}$ and inverter $I_{73}$ are powered by the selected voltage domain VDD_WL outputted by the power mux 710.

In operation, during programming, the read/not-write enable signal R/W̄_EN is set to a logic low voltage (e.g., at VSS). In response, the inverter $I_{71}$ generates a logic high voltage (e.g., at VDD_PX). This causes PMOS M71 to turn off and inverter $I_{72}$ to output a logic low voltage (e.g., at VSS). The logic low voltage outputted by inverter $I_{72}$ causes PMOS M72 to turn on. Accordingly, the power mux 710 generates the output voltage domain VDD_WL at the programming voltage VDD_PX.

Also, during programming, the NAND-gate $A_{71}$ receives the write-asserted global word line signal gwl1 and the asserted subarray enable signal sa_en1. In response, the NAND-gate $A_{71}$ generates a logic low voltage (e.g., at VSS). In response to the logic low voltage, the inverter $I_{73}$ generates a write-asserted local word line signal lwl11 as a logic high voltage (e.g., at VDD_PX) for programming one or more memory cells receiving the signal.

During reading, the read/not-write enable signal R/W̄_EN is set to a logic high voltage (e.g., at VDD_PX). In response, the inverter $I_{71}$ generates a logic low voltage (e.g., at VSS). This causes PMOS M71 to turn on and inverter $I_{72}$ to output a logic high voltage (e.g., at VDD_PX). The logic high voltage outputted by inverter $I_{72}$ causes PMOS M72 to turn off. Accordingly, the power mux 710 generates the output voltage domain VDD_WL at the reading (core) voltage VDD_MX.

Also, during reading, the NAND-gate $A_{71}$ receives the read-asserted global word line signal gwl1 and the asserted subarray enable signal sa_en1. In response, the NAND-gate $A_{71}$ generates a logic low voltage (e.g., at VSS). In response to the logic low voltage, the inverter $I_{73}$ generates a read-asserted local word line signal lwl11 as a logic high voltage (e.g., at VDD_MX) for effectuating the reading of data from one or more memory cells receiving the signal.

Figure 8:
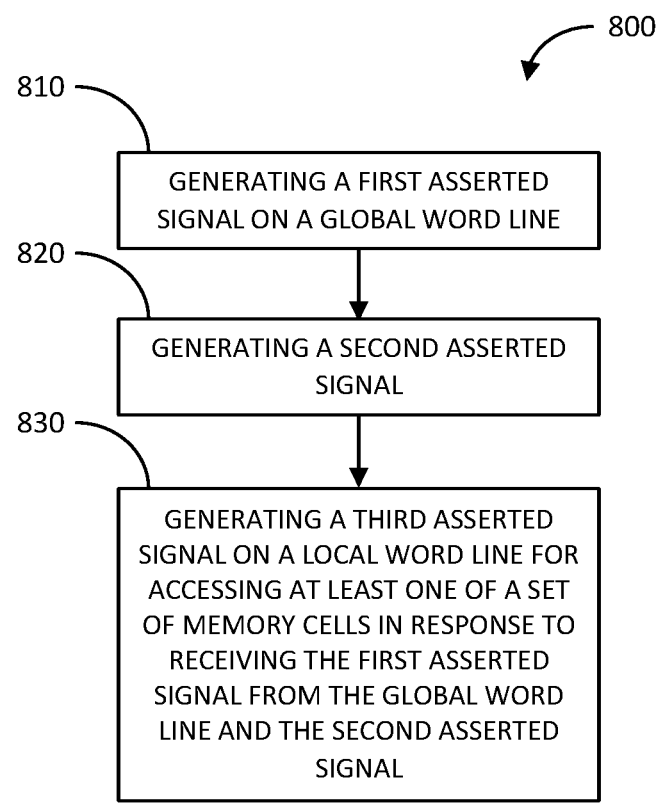
FIG. 8 illustrates a flow diagram of an exemplary method of accessing at least one of a set of memory cells in accordance with another aspect of the disclosure.

FIG. 8 illustrates a flow diagram of an exemplary method 800 of accessing (programming or reading) at least one of a set of memory cells in accordance with another aspect of the disclosure. The method 800 includes generating a first asserted signal on a global word line (block 810). Examples of means for generating the first asserted signal on a global word line include any one of the global word line drivers WD1 to WDM in OTP memories 300 and 400, and global word line driver 500.

The method 800 further includes generating a second asserted signal (block 820). Examples of means for generating the second asserted signal include any one of the multiple-input OR-gate circuits 330-1 to 330-K, 430-1 to 430-K, and multiple-OR gate circuit 600.

The method 800 further includes generating a third asserted signal on a local word line for accessing at least one of a set of memory cells in response to receiving the first asserted signal from the global word line and the second asserted signal (block 830). Examples of means for generating the third asserted signal include any one of the local word line drivers LD11 to LDMK in OTP memories 300 and 400, and local word line driver 700.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A memory, comprising:
    a first global word line;
    a first set of bit lines;
    a first local word line;
    a first set of memory cells coupled to the first local word line and coupled to the first set of bit lines, respectively;
    a first local word line driver configured to generate a first asserted signal on the local word line in response to receiving a second asserted signal from the first global word line and a third asserted signal;
    a first set of bit line drivers configured to apply programming voltages on the first set of bit lines based on a first set of bit line programming signals, respectively; and
    a multiple-input OR-gate configured to generate the third asserted signal in response to at least one of the first set of bit line programming signals being asserted.

2. The memory of claim 1, wherein the third asserted signal indicates that at least one of the programming voltages is applied to at least one of the first set of bit lines for programming at least one of the first set of memory cells, respectively.

3. The memory of claim 1, wherein the first asserted signal is configured to effectuate the programming of the at least one of the first set of memory cells.

4. The memory of claim 1, further comprising a sense amplifier coupled to the first set of bit lines, wherein the first asserted signal is configured to effectuate a reading of data from the first set of memory cells by the sense amplifier.

5. The memory of claim 4, wherein the first set of bit line drivers are configured to be tri-stated during the reading of the data from the first set of memory cells by the sense amplifier.

6. The memory of claim 1, wherein at least one of the first set of memory cells is configured as an EFUSE memory cell.

7. The memory of claim 1, wherein at least one of the first set of memory cells comprises a fuse element coupled in series with a transistor between a corresponding one of the first set of bit lines and a voltage rail.

8. The memory of claim 1, wherein at least one of the first set of memory cells is configured as an antifuse memory cell.

9. The memory of claim 1, wherein at least one of the first set of memory cells each includes at least one core device.

10. The memory of claim 1, further comprising:
    a second local word line;
    a second set of bit lines;
    a second set of memory cells coupled to the second local word line and coupled to the second set of bit lines, respectively; and
    a second local word line driver configured to generate a fourth asserted signal on the second local word line in response to receiving the second asserted signal from the first global word line and a fifth asserted signal.

11. The memory of claim 1, further comprising:
    a second global word line;
    a second local word line;
    a second set of memory cells coupled to the second local word line and coupled to the first set of bit lines, respectively; and
    a second local word line driver configured to generate a fourth asserted signal on the second local word line in response to receiving a fifth asserted signal from the second global word line and the third asserted signal.

12. The memory of claim 1, further comprising a word line decoder including a global word line driver configured to generate the second asserted signal.

13. The memory of claim 12, wherein the global word line driver is configured to:
    generate the second asserted signal at a first voltage for effectuating a programming of at least one of the first set of memory cells; or
    generate the second asserted signal at a second voltage for effectuating a reading of data from at least one of the first set of memory cells.

14. A method, comprising:
    generating a first asserted signal on a global word line;
    generating a second asserted signal;
    generating a third asserted signal on a local word line for accessing at least one of a set of memory cells in response to receiving the first asserted signal from the global word line and the second asserted signal;
    generating at least one programming voltage on a set of bit lines based on a set of bit line programming signals, respectively; and
    performing a logical OR operation of the bit line programming signals to generate the second asserted signal.

15. The method of claim 14, wherein the third asserted signal indicates that the least one of the programming voltage is applied to at least one of the set of bit lines coupled to the set of memory cells, respectively.

16. The method of claim 14, wherein the third asserted signal is configured to effectuate the programming of the at least one of the set of memory cells.

17. The method of claim 14, further comprising generating a fourth asserted signal configured to effectuate a reading of data from the at least one of the set of memory cells, wherein the fourth asserted signal is generated in response to a fifth asserted signal from the global word line and a sixth asserted signal.

18. The method of claim 14, wherein at least one of the set of memory cells is configured as an EFUSE memory cell.

19. The method of claim 14, wherein at least one of the set of memory cells is configured as an antifuse memory cell.

20. The method of claim 14, wherein at least one of the set of memory cells each includes at least one core device.

21. An apparatus, comprising:
    means for generating a first asserted signal on a global word line;
    means for generating a second asserted signal;
    means for generating a third asserted signal on a local word line for accessing at least one of a set of memory cells in response to receiving the first asserted signal from the global word line and the second asserted signal;
    means for generating at least one programming voltage on a set of bit lines based on a set of bit line programming signals, respectively; and means for performing a logical OR operation of the bit line programming signals to generate the second asserted signal.

22. The apparatus of claim 21, wherein the third asserted signal indicates that a programming voltage is applied to at least one of the set of bit lines for programming the at least one of the set of memory cells.

23. The apparatus of claim 21, wherein the third asserted signal is configured to effectuate the programming of at least one of the set of memory cells.

24. The apparatus of claim 21, further comprising means for generating a fourth asserted signal configured to effectuate a reading of data from at least one of the set of memory cells, wherein the fourth asserted signal is generated in response to the fifth asserted signal from the global word line and a sixth asserted signal.

25. The apparatus of claim 21, wherein at least one of the set of memory cells is configured as an EFUSE memory cell.

26. The method of claim 21, wherein at least one of the set of memory cells is configured as an antifuse memory cell.

27. The apparatus of claim 21, wherein at least one of the set of memory cells includes at least one core device.

\* \* \* \* \*